United States Patent [19]
Yang

[11] Patent Number: 5,824,578
[45] Date of Patent: Oct. 20, 1998

[54] METHOD OF MAKING A CMOS TRANSISTOR USING LIQUID PHASE DEPOSITION

[75] Inventor: Ching-Nan Yang, Hsinchu, Taiwan

[73] Assignee: Mosel Vitelic Inc., Hsinchu, Taiwan

[21] Appl. No.: 764,336

[22] Filed: Dec. 12, 1996

[51] Int. Cl.$^6$ .................................................. H01L 21/8238
[52] U.S. Cl. ............................................ 438/231; 438/229
[58] Field of Search .................................. 437/56, 57, 58, 437/34, 40 RCM; 438/231, 229, 232

[56] References Cited

U.S. PATENT DOCUMENTS 5,270,233  12/1993  Hamatake ................................. 437/57
5,521,106   5/1996  Okabe ...................................... 437/34

*Primary Examiner*—Michael Trinh
*Attorney, Agent, or Firm*—Bacon & Thomas

[57] ABSTRACT

A method of making a complementary metal oxide semiconductor field effect transistor (CMOSFET) using liquid phase deposition. At first, a P-type silicon substrate is prepared, on which are formed a field oxide layer, a P-well, an N-well and a gate oxide layer. Next, a first polysilicon layer is formed. After doping the first polysilicon, a tungsten silicide layer is formed on the first polysilicon layer. Then, the first polysilicon layer and the tungsten silicide layer are patterned to form the polycide gate electrodes. With a mask shielding the area designated to be the N-channel FET, a P$^-$ type ion implant is performed. Then, a first silicon dioxide layer is formed by liquid phase deposition, followed by an anisotropic etching to form the first sidewall spacers. Then, a P$^+$ type ion implant is performed. A second silicon dioxide layer is again formed by liquid phase deposition. Now, after removing the mask, an N$^-$ type ion implant is performed using the second silicon dioxide layer as a mask. Next, the second sidewall spacers are formed by depositing and etching back a layer of tetraethoxysilanes dielectric layer. Then, an N$^+$ type ion implant is performed to form the N$^+$ doped areas. After a boronphosphosilicate glass layer is deposited on the field oxide layer, the second silicon dioxide layer and the device area, the CMOSFET is completed.

24 Claims, 8 Drawing Sheets

METHOD OF MAKING A CMOS TRANSISTOR USING LIQUID PHASE DEPOSITION

BACKGROUND OF INVENTION (1) Field of the Invention

The present invention relates to a method of making a complementary metal oxide semiconductor field effect transistor (CMOSFET), especially to a method of making a complementary metal oxide semiconductor field effect transistor using liquid phase deposition (LPD) in forming the lightly doped drain (LDD) structure.

(2) Description of the Prior Art

With the continual improvement of semiconductor chip fabrication techniques, the number of transistors which can be packed onto a semiconductor wafer has increased greatly. While the size of the individual transistors have decreased remarkably, the gate length and the natural channel length in a transistor are decreased continually. This results in the so-called short channel effect and further induces the hot carrier effect in an N-channel MOSFET.

When the size of the individual transistors have decreased, if the power remains the same, the lateral electrical field acting on the transistor will increase greatly and concentrate in the drain area, which induces hot carriers. The hot carriers on the N-channel acquire great energy through the increased lateral electrical field. Portion of the hot carriers are even so energized to inject into the gate oxide, causing the threshold voltage $V_t$ of the transistor to shift. Therefore, the saturation current, the transfer conductance and the carrier mobility of the transistor will be greatly degraded.

In the past, the so-called Lightly Doped Drain (LDD) has been widely used to solve this problem. According to this approach, a lightly doped drain is formed to reduced the effect of the lateral electrical field. FIGS. 1(A) to 1(G) demonstrate the prior art method of making a LDD structure.

At first, a P type silicon substrate is prepared. The field oxide regions 2, a P-well 3, an N-well 4 and a gate oxide layer 5 with a thickness of 1000 Angstroms are formed on the silicon substrate 1. Next, a first polysilicon is formed using the chemical vapor deposition. Then the first polysilicon is patterned to form the gate electrodes 6 as shown in FIG. 1(A).

Then, with the help of mask 8, an ion implant 9 of N⁻ type LDD implant is performed with phosphorus ions with a dosage of $1\times10^{13}$ ions/cm² at an energy of 50 keV, forming the N⁻ type LDD areas 10, as shown in FIG. 1(B).

Next, with the help of mask 11, a P⁻ type LDD implant 12 of $BF_2$ ions is performed with a dosage of $1\times10^{13}$ ions/cm² at an energy of 50 keV, forming the P⁻ type LDD areas 10, as shown in FIG. 1(C).

Then, as shown in FIG. 1(D), the sidewall spacers 14 with a thickness of between 800 and 1000 Angstroms is formed on the sidewall of the gate electrode by first depositing a TEOS dielectric layer and followed by the anisotropically etching.

Now, as shown in FIG. 1(E), an ion implant of N⁺ type implant 16 is performed with the help of mask 15, with a dosage of $1\times10^{15}$ ions/cm² at an energy of 60 keV, forming an N-doped area 17.

Then, as shown in FIG. 1(F), an P⁺ type implant 19 of $BF_2$ ions is performed with the help of mask 18, with a dosage of $1\times10^{15}$ ions/cm² at an energy of 50 keV, forming a P-doped area 20.

Next, a neutral silicate glass (NSG) insulating layer 21, i.e. a silicon oxide layer without any dopant, is formed on the field oxide layer and the entire device area using the chemical vapor deposition. Then, a silicon oxide layer containing boron and phosphorus dopants is formed on the insulating layer 21 using the chemical vapor deposition, forming a boronphosphosilicate glass (BPSG) layer 22, as shown in FIG. 1(G).

The above described conventional LDD process needs many masks. This extensive application of masks not only increases the complexity and the cost of fabrication process, but also brings about other detrimental effects, such as contaminating particulate, degrading the device performance. To solve this problem, the present invention provides a method of making a CMOSFET device using liquid phase deposition, which is able to complete the LDD structure with only one mask.

The Liquid Phase Deposition (LPD) is a newly developed technology, which can be used to grow silicon dioxide in an aqueous solution at low temperature. Having the features of selective deposition against photoresist and conformal growth, the silicon dioxide prepared by LPD can be used to form spacers and masking layers to simplify the LDD process. Liquid Phase Deposition of silicon dioxide is described in the article entitled "A Selective $SiO_2$ Film-Formation Technology Using Liquid-Phase Deposition for Fully Planarized Multilevel Interconnections," J. Electrochem. Soc., Vol. 140, No. 8, August 1993, which is fully incorporated by reference.

Within the prior art, there are some references addressing different applications of liquid phase oxide deposition, however, none appear to be directed to the specific application of the present invention, namely the use of the phase liquid oxide deposition to simplify the LDD process in making a CMOSFET. For example, U.S. Pat. No. 5,470,681 provides an improved phase shift mask structure for making lithographic exposures by selective deposition of oxide through openings in a pattern of polyimide or similar organic material. U.S. Pat. No. 5,472,898 utilizes a silicon dioxide formed by liquid phase deposition in making a mask ROM. U.S. Pat. No. 5,472,902 discloses a method of forming an isolation structure on a silicon substrate having a silicon-on-insulator (SOI) structure.

SUMMARY OF THE INVENTION

It is therefore a primary object of the present invention to provide a method of making a CMOSFET using liquid phase deposition which can reduce the number of masks used, simplifying the manufacturing process.

It is another object of the present invention to provide a method of making the LDD structure of a CMOSFET using liquid phase deposition which can restrain effectively the hot carrier effect and the punch through effect in short channel devices.

In order to accomplish these and other objects, the present invention discloses a method of making a CMOSFET, which comprises the steps of: (a) providing a P-type silicon substrate, on which are formed the field oxide regions, a P-well, an N-well and a gate oxide layer; (b) forming a first polysilicon layer by low pressure chemical vapor deposition and doping the first polysilicon, then after forming a tungsten silicide layer on the first polysilicon layer, patterning the first polysilicon layer and the tungsten silicide layer to form a polycide gate electrode; (c) with a first mask shielding the area designated to be the N-channel, performing a P⁻ type ion implant; (d) forming a silicon dioxide layer by liquid phase deposition; (e) forming the sidewall spacers; (f) performing a P⁺ type ion implant; (g) forming a silicon dioxide (LPD-SiO₂) layer with a thickness of between about 6000 and about 7000 Angstroms by liquid phase deposition; (h) removing the first mask and performing an N⁻ type ion implant using the LPD-SiO₂ layer as a mask; (i) depositing and etching back a layer of tetraethoxysilanes dielectric layer to form the sidewall spacers; (j) performing an N⁺ type ion implant to form an N⁺ type doping area; (k) depositing a natural silicate glass (NSG) layer to protect boron or phosphorus contamination due to the succeeding BPSG deposition; (l) depositing a layer of boronphosphosilicate glass (BPSG) by chemical vapor deposition on the field oxide layer, NSG layer, LPD-SiO₂ layer and the device area, and thus completing the CMOSFET.

BRIEF DESCRIPTION OF THE DRAWINGS

Other objects and advantages of the present invention will be understood by reading the detailed explanation of embodiments with reference to the accompanying drawings in which.

DETAILED DESCRIPTION OF THE PREFERRED EMBODIMENTS

The present invention will be described in detail below with reference to the accompanying drawings.

Figure 1A:
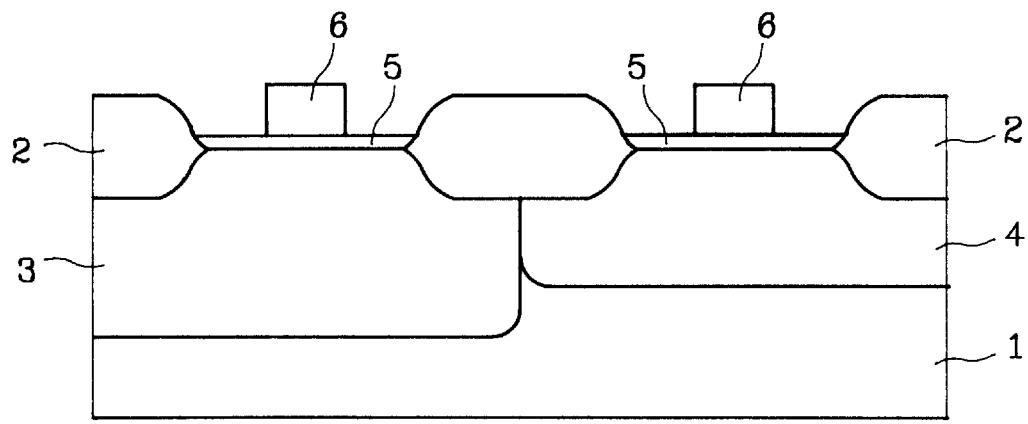
FIG. 1(A) to 1(G) show cross-sectional views of semiconductor device explaining a conventional method of making a CMOSFET.
Figure 1B:
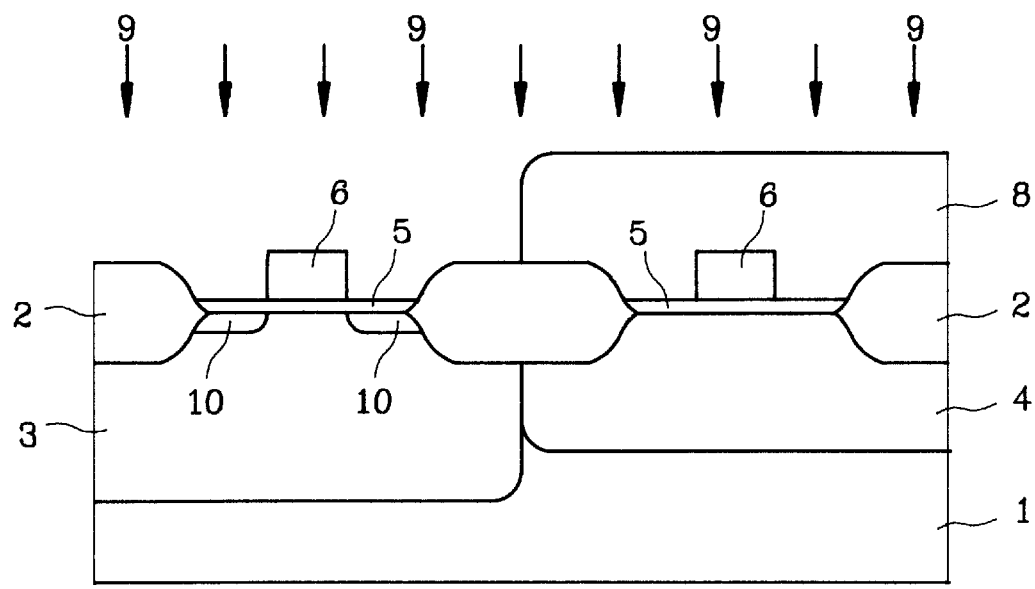
Figure 1C:
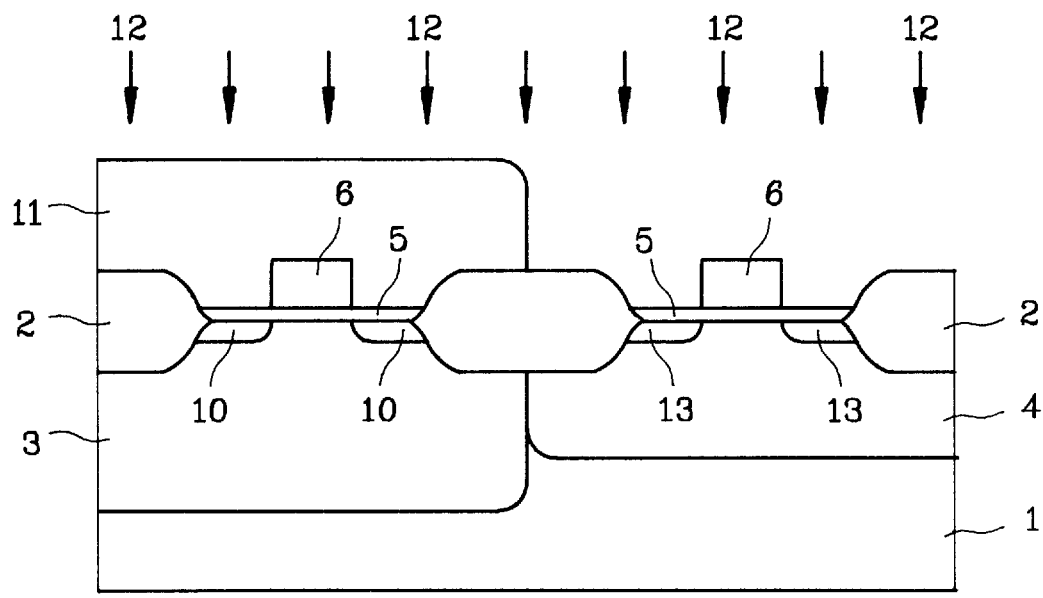
Figure 1D:
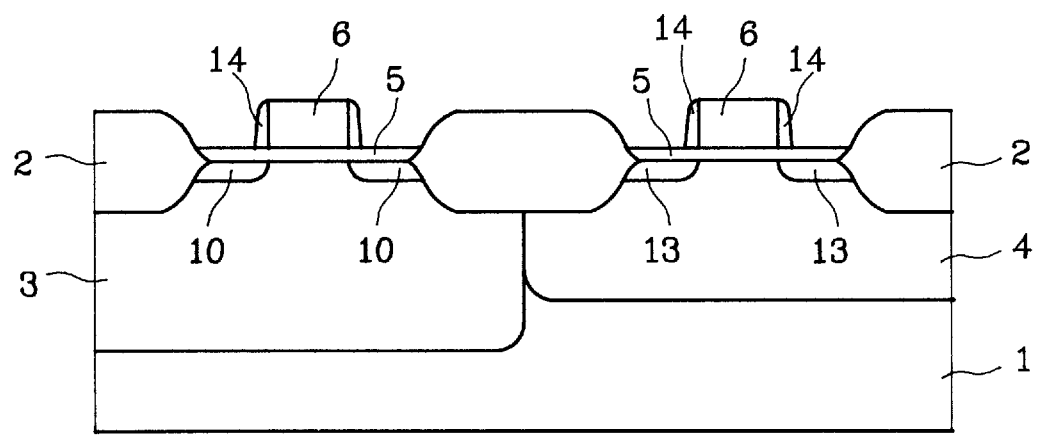
Figure 1E:
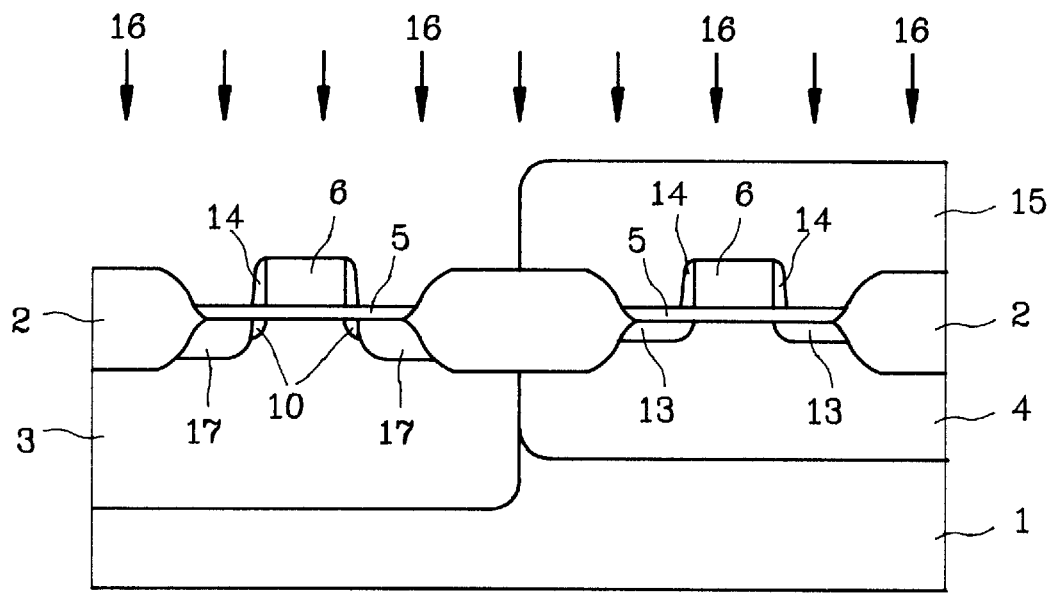
Figure 1F:
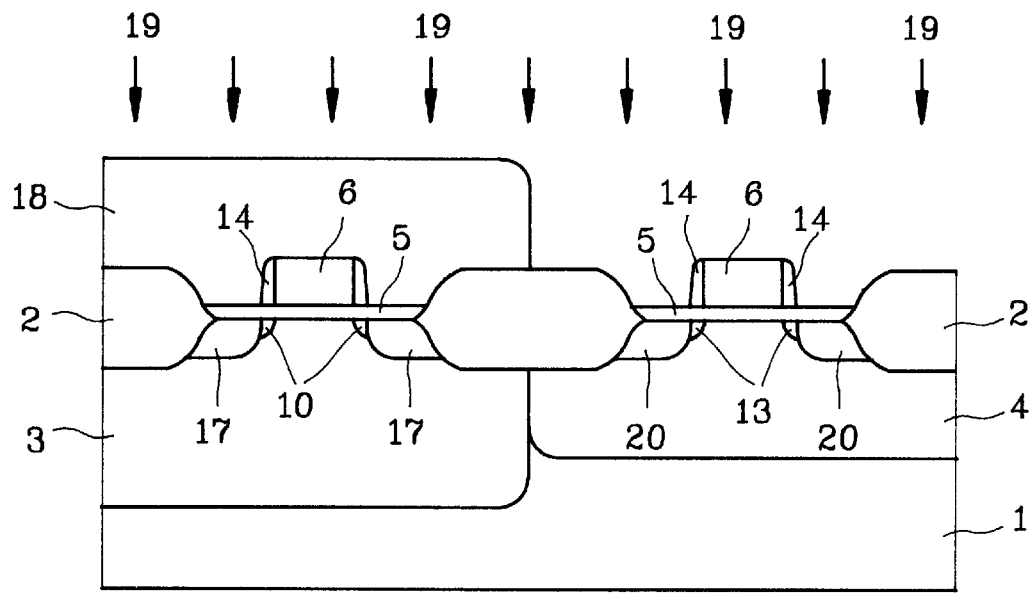
Figure 1G:
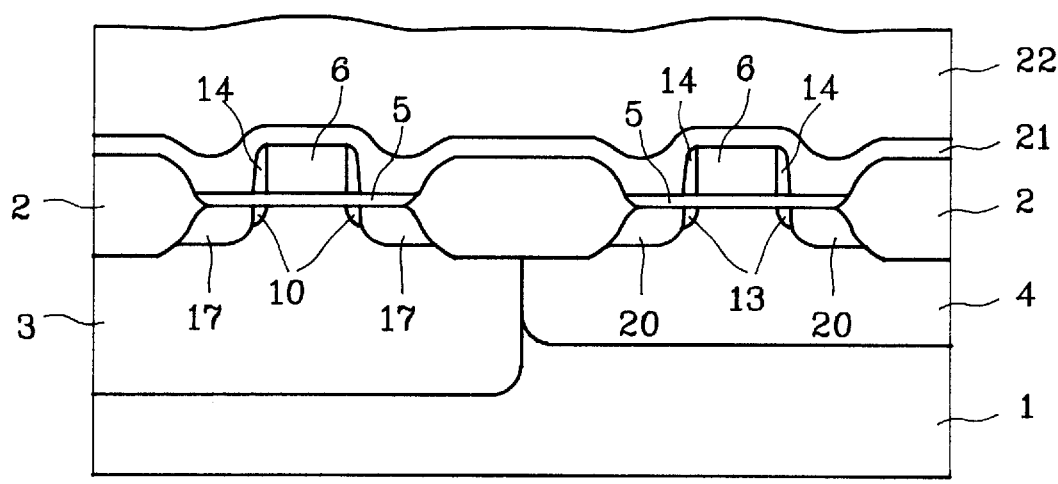
Figure 2A:
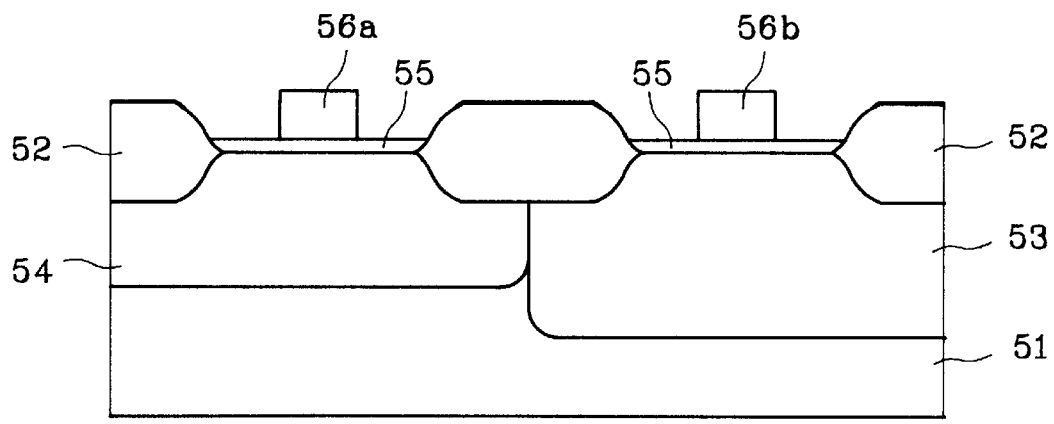
FIG. 2(A) to 2(H) show cross-sectional views of semiconductor device explaining the method of making a CMOSFET according to the present invention.

Refer now to FIG. 2(A). At first, as the conventional process, a P type 15 silicon substrate 51 is prepared. After the field oxide regions 52 are formed on the substrate by the conventional isolation technique, a P-well 53 and an N-well 54 are formed in the substrate. Next, a gate oxide layer 55 with a thickness of about 200 Angstroms is formed. Then, a first polysilicon layer is formed by low pressure chemical vapor deposition with a thickness of about 1500 Angstroms. After the first polysilicon layer is doped, a tungsten silicide (WSi_x) layer which is overlaying the first polysilicon layer is formed by chemical vapor deposition with a thickness of about 1000 Angstroms. Then, the first polysilicon layer and the tungsten silicide layer are patterned to form polycide gate electrodes 56a and 56b by the conventional photolithography and etching techniques.

Figure 2B:
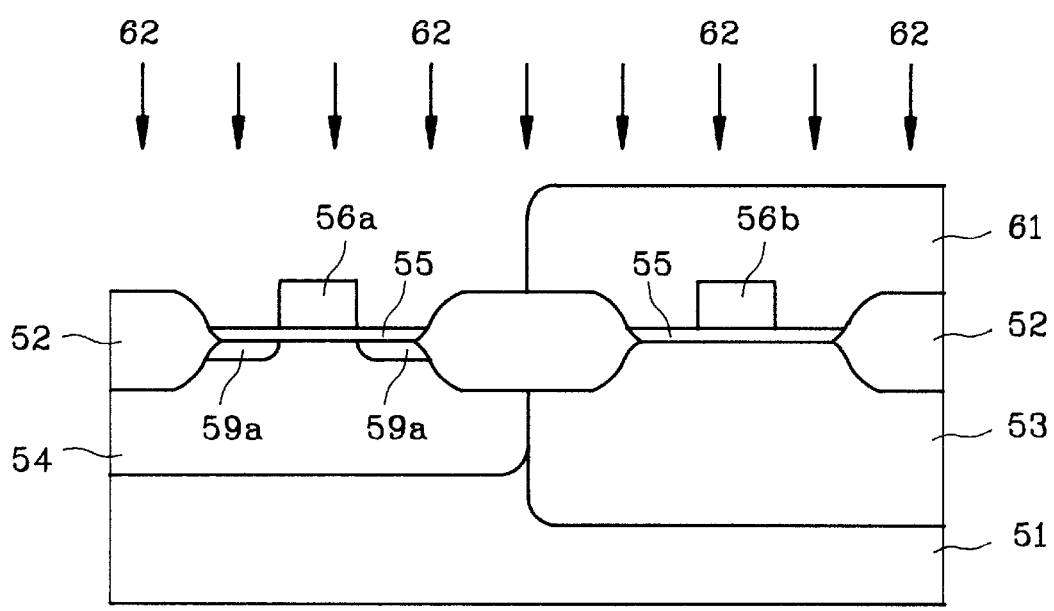

As shown in FIG. 2(B), with a first mask 61 shielding the area designated to be the N-channel MOSFET on the substrate 51, a P⁻ type ion implant 62 of BF₂ ions is performed with a dosage of $5 \times 10^{12}$ to $5 \times 10^{13}$ ions/cm² at an energy of about 30 to 40 keV. As a result, the P⁻ type LDD areas 59a are formed.

Figure 2C:
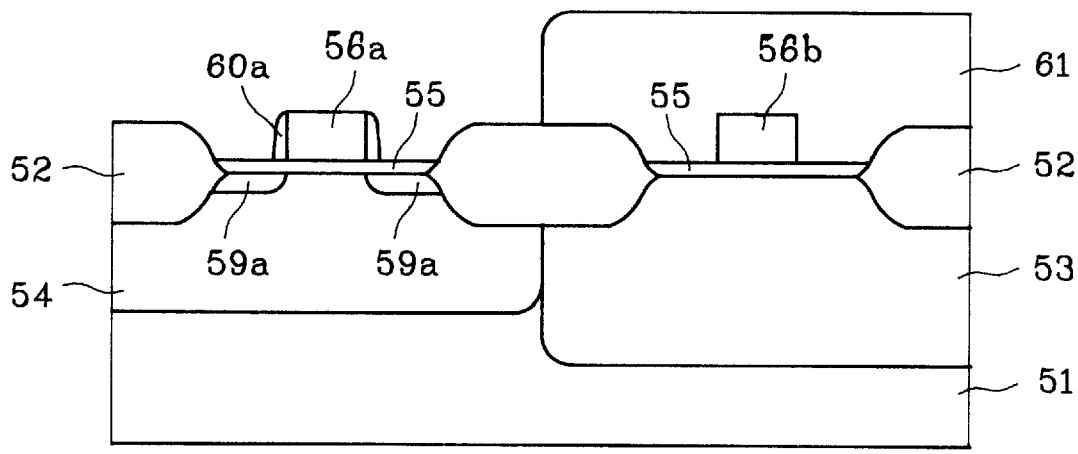

Now, as shown in FIG. 2(C), a layer of silicon dioxide (SiO₂) layer with a thickness of about 2000 Angstroms is formed by liquid phase deposition, which is referred as the first LPD-SiO₂. Then, an anisotropic etching is performed to etch the first LPD-SiO₂, forming the sidewall spacers 60a with a thickness of between about 800 and about 1000 Angstroms.

The LPD-SiO₂ film can be deposited by immersing the silicon substrate 51 into the supersaturated hydrofluorosilicic acid (H₂SiF₆) solution with silica gel. The chemical reaction is a reversible one which is shown in equation (1):

$$H_2SiF_6 + 2H_2O \leftarrow\rightarrow 6HF + SiO_2\downarrow \quad (1)$$

In the equation (1), the addition of SiO₂ (silica-gel) leads to a shift from right toward left. Therefore, the SiO₂ saturated hydrofluorosilicic acid solution may include hydrofluoric acid (HF) which is minimized in the equation (1).

However, this equilibrium can be changed by the addition of boric acid or aluminum to the solution, whose reaction equations are shown in the following:

$$H_3BO_3 + 4HF \leftarrow\rightarrow BF_4^- + H_3O^+ + 2H_2O \quad (2)$$

$$2Al + 12HF \leftarrow\rightarrow 6H_3AlF_6 + 3H_2 \quad (3)$$

Accordingly, the addition of boric acid or aluminum to the solution shifts the equilibrium process (1) from left toward right and helps the SiO₂ to deposit.

Figure 2D:
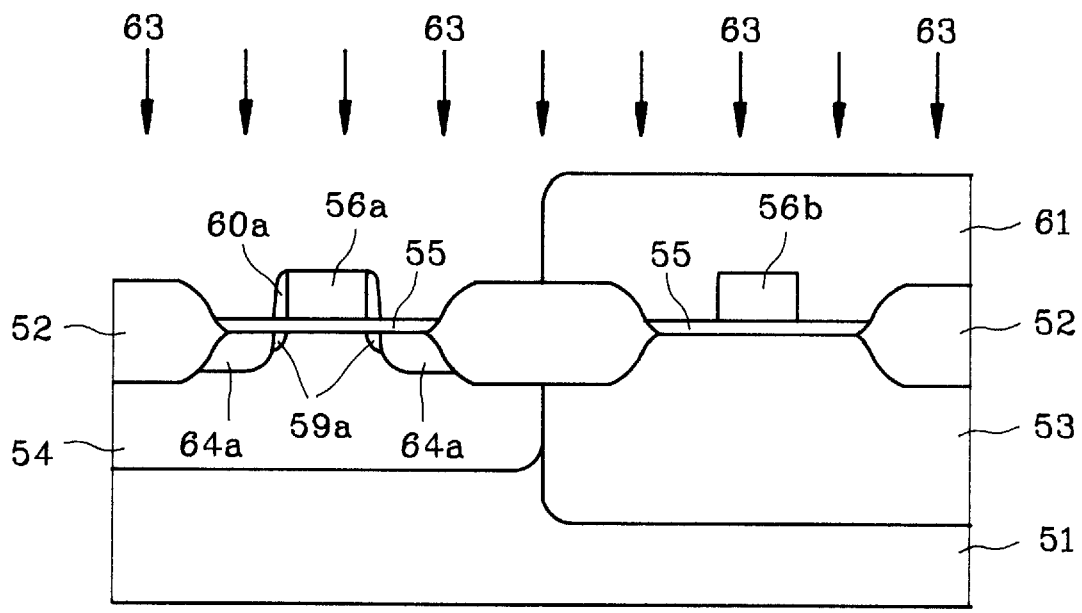

Next, as shown in FIG. 2(D), with the first mask 61 remained, a P⁺ type ion implant 63 of BF₂ ions is performed with a dosage of $1 \times 10^{15}$ to $5 \times 10^{15}$ ions/cm² at an energy of about 50 to 60 keV, forming the P⁺ type source/drain areas 64a.

Figure 2E:
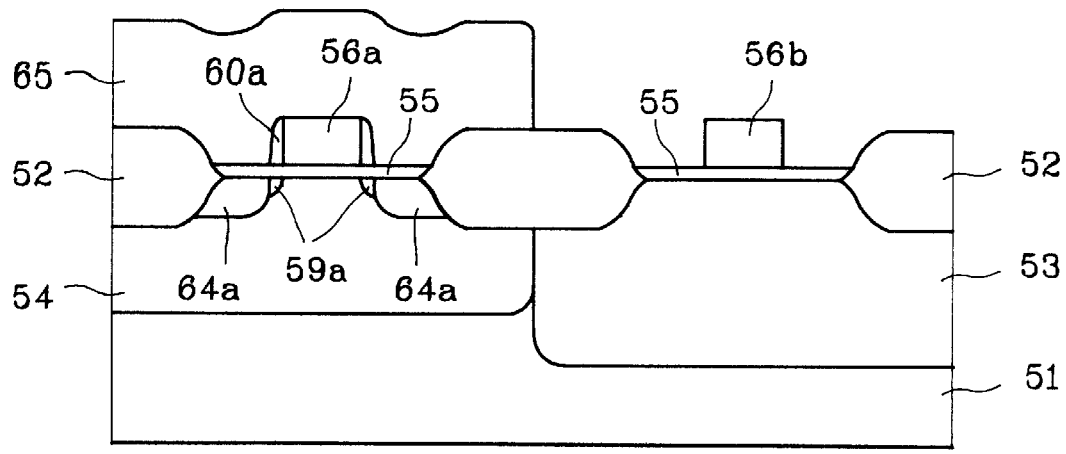

Then, a second LPD-SiO₂ layer 65 is formed by liquid phase deposition as described above with a thickness of between about 6000 and about 7000 Angstroms. Then the mask 61 is removed as shown in FIG. 2(E).

Figure 2F:
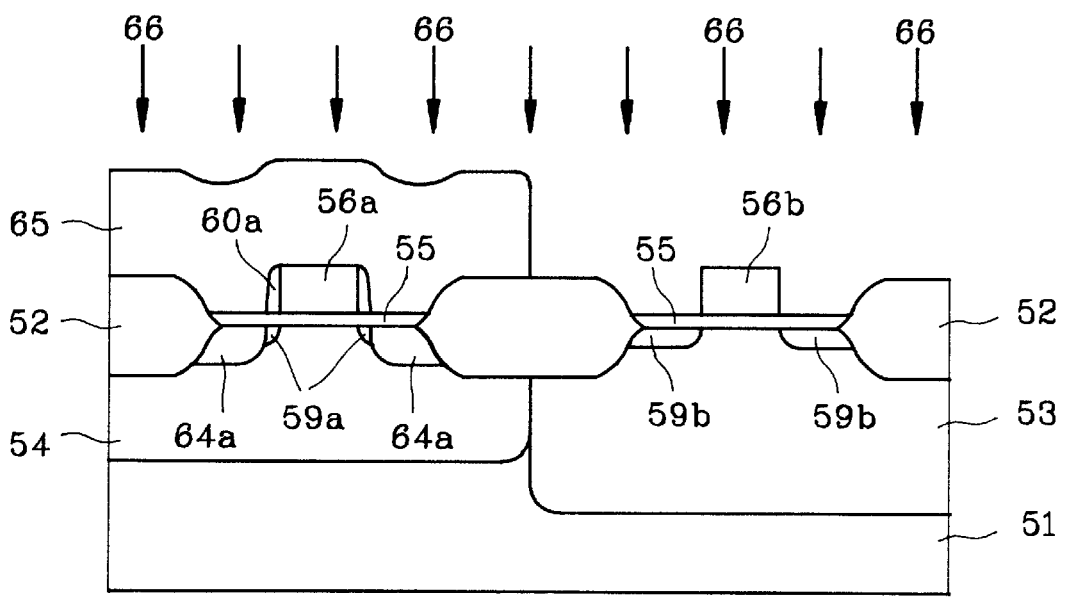

Next, referring to FIG. 2(F), an N⁻ type ion implant 66 is performed with the second LPD-SiO₂ layer 65 as the mask, with a phosphorus (P³¹) dosage of about $5 \times 10^{12}$ to $5 \times 10^{13}$ ions/cm² at an energy of about 40 to 50 keV. As a result, the N⁻ type LDD areas 59b are formed.

Figure 2G:
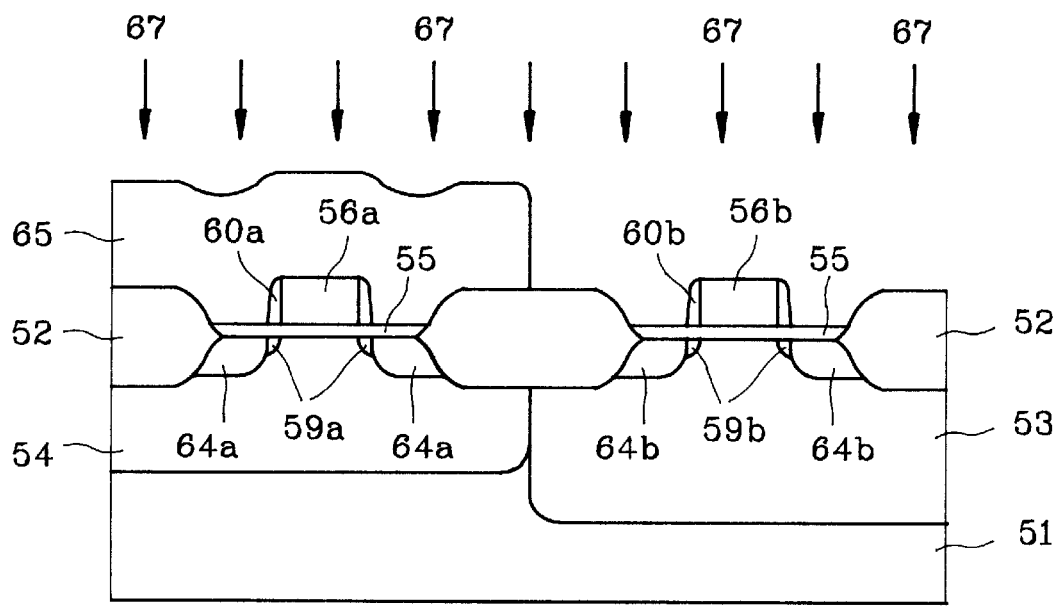

Then, a layer of tetraethoxysilanes (TEOS) dielectric layer with a thickness of about 2000 Angstroms is formed by chemical vapor deposition. This TEOS dielectric layer is then etched by an anisotropic etching to form the sidewall spacers 60b with a thickness of from about 1000 to about 1200 Angstroms. Next, an N⁺ type ion implant 67 is performed with an Arsenic (As⁷⁵) dosage of about $1 \times 10^{15}$ to $5 \times 10^{15}$ ions/cm² at an energy of about 60 to 70 keV. As a result, an N⁺ type source/drain doping area 64b is formed as shown in FIG. 2(G).

Figure 2H:
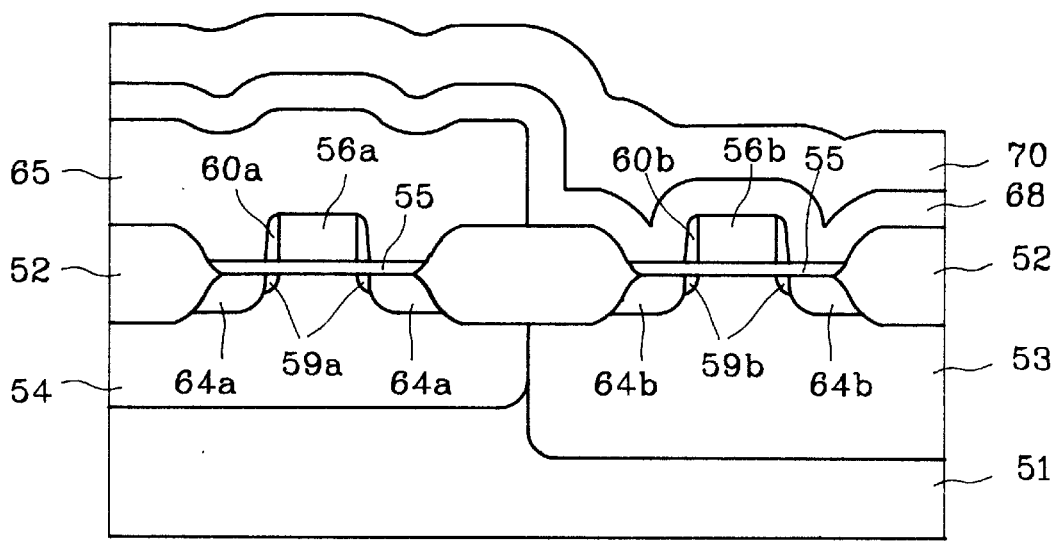

Now, referring to FIG. 2(H), a natural silicate glass (NSG) layer 68 and a boronphosphosilicate glass (BPSG) layer 70 are sequentially deposited on the second LPD-SiO₂ layer, the field oxide layer and the device area by chemical vapor deposition. Thus, the LDD structure of the CMOSFET according to the present invention is completed.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of making a complementary metal semiconductor field effect transistor (CMOSFET) using liquid phase deposition which comprises the steps of:

(a) preparing a silicon substrate, upon which are formed at least one field oxide region, a P-well, an N-well and a plurality of gate electrodes with underlying gate oxide layers;

(b) performing a P⁻ type ion implant with a first mask shielding the area designated to be an N-channel field effect transistor, to form P⁻ type lightly doped drain (LDD) areas;

(c) depositing a first silicon dioxide layer using liquid phase deposition without removing said first mask;

(d) etching said first silicon dioxide layer to form first sidewall spacers along sidewalls of one of said gate electrodes;

(e) performing a P⁺ type ion implant without removing said first mask to form P⁺ type source/drain areas and completing a P-channel field effect transistor;

(f) depositing a second silicon dioxide layer as a second mask on the P-channel field effect transistor by liquid phase deposition;

(g) performing an N⁻ type ion implant without removing said second mask to form N⁻ type LDD areas;

(h) depositing a dielectric layer over the entire silicon substrate;

(i) etching said dielectric layer to form second sidewall spacers along sidewalls of gate electrodes not covered by said second mask;

(j) performing an N⁺ type ion implant, to form N⁺ type source/drain areas and completing a N-channel field effect transistor; and (k) sequentially depositing a first insulating layer and a second insulating layer on the field oxide layer, the second silicon dioxide layer and the transistors, completing the CMOSFET.

2. The method as claimed in claim 1, wherein said P⁺ type ion implant is performed of BF$_2$ ions with a dosage of about $5\times10^{12}$ to $5\times10^{13}$ ions/cm² at an energy of about 30 to 40 keV.

3. The method as claimed in claim 1, wherein said first silicon dioxide layer deposited by liquid phase deposition has a thickness of about 2000 Angstroms.

4. The method as claimed in claim 3, wherein said liquid phase deposition of said first silicon dioxide layer is based on a reaction equation of:

$$H_2SiF_6 + 2H_2O \leftarrow\rightarrow 6HF + SiO_2\downarrow.$$

5. The method as claimed in claim 4, which further comprises the step of: adding boric acid (H$_3$BO$_3$) to the reaction solution of said liquid phase deposition to help the SiO$_2$ to deposit.

6. The method as claimed in claim 1, wherein said first sidewall spacers are formed by an anisotropic etching of the first silicon dioxide layer.

7. The method as claimed in claim 6, wherein said first sidewall spacers have a thickness of ranging from 800 to 1000 Angstroms.

8. The method as claimed in claim 1, wherein said P⁺ type ion implant is performed of BF$_2$ ions with a dosage of about $1\times10^{15}$ to $5\times10^{15}$ ions/cm² at an energy of about 50 to 60 keV.

9. The method as claimed in claim 1, wherein said second silicon dioxide layer deposited by liquid phase deposition has a thickness of ranging from 6000 to 7000 Angstroms.

10. The method as claimed in claim 9, wherein said liquid phase deposition of said second silicon dioxide layer is based on a reaction equation of:

$$H_2SiF_6 + 2H_2O \leftarrow\rightarrow 6HF + SiO_2\downarrow.$$

11. The method as claimed in claim 10, which further comprises the step of: adding boric acid (H$_3$BO$_3$) or aluminum to the reaction solution of said liquid phase deposition to help the SiO$_2$ to deposit.

12. The method as claimed in claim 1, wherein said N⁻ type ion implant is performed of phosphorus (P$^{31}$) ions with a dosage of about $5\times10^{12}$ to $5\times10^{13}$ ions/cm² at an energy of about 40 to 50 keV.

13. The method as claimed in claim 1, wherein said dielectric layer is a tetraethoxysilanes (TEOS) layer.

14. The method as claimed in claim 13, wherein said dielectric layer has a thickness of about 2000 Angstroms.

15. The method as claimed in claim 1, wherein said second sidewall spacers are formed by an anisotropic etching of the dielectric layer.

16. The method as claimed in claim 15, wherein said second sidewall spacers have a thickness ranging from 1000 to 2000 Angstroms.

17. The method as claimed in claim 1, wherein said N⁺ type ion implant is performed of arsenic (As$^{75}$) ions with a dosage of about $1\times10^{15}$ to $5\times10^{15}$ ions/cm² at an energy of about 60 to 70 keV.

18. The method as claimed in claim 1, wherein said first insulating layer is a neutral silicate glass (NSG) layer.

19. The method as claimed in claim 1, wherein said second insulating layer is a boronphosphosilicate glass (BPSG) layer.

20. The method as claimed in claim 1, wherein said first sidewall spacers have a different thickness from that of said second sidewall spacers.

21. The method as claimed in claim 1, wherein said liquid phase deposition is based on a reaction equation of:

$$H_2SiF_6 + 2H_2O \leftarrow\rightarrow 6HF + SiO_2\downarrow.$$

22. The method as claimed in claim 21, wherein said liquid phase deposition is a reversible reaction.

23. The method as claimed in claim 4, which further comprises the step of adding aluminum to the reaction solution of said liquid phase deposition to help the SiO$_2$ to deposit.

24. The method as claimed in claim 10, which further comprises the step of adding aluminum to the reaction solution of said liquid phase deposition to help the SiO$_2$ to deposit.

* * * * *